United States Patent [19]

Tan

[11] Patent Number: 5,737,766
[45] Date of Patent: Apr. 7, 1998

[54] PROGRAMMABLE GATE ARRAY CONFIGURATION MEMORY WHICH ALLOWS SHARING WITH USER MEMORY

[75] Inventor: Charles M. C. Tan, Santa Clara, Calif.

[73] Assignee: Hewlett Packard Company, Palo Alto, Calif.

[21] Appl. No.: 599,883

[22] Filed: Feb. 14, 1996

[51] Int. Cl.⁶ ............................................. G06F 12/00
[52] U.S. Cl. .................................. 711/170; 365/189.08
[58] Field of Search .......................... 395/497.01, 497.04, 395/474, 480; 326/39, 41; 365/189.08

[56] References Cited

U.S. PATENT DOCUMENTS

| | | | |
|---|---|---|---|
| 5,099,150 | 3/1992 | Steele | 307/465 |
| 5,414,377 | 5/1995 | Freidin | 326/41 |
| 5,432,719 | 7/1995 | Freeman et al. | 364/579 |
| 5,469,003 | 11/1995 | Kean | 326/39 |
| 5,583,450 | 12/1996 | Trimberger et al. | 326/41 |
| 5,600,597 | 2/1997 | Kean et al. | 365/189.08 |

*Primary Examiner*—Tod R. Swann
*Assistant Examiner*—Conley B. King, Jr.
*Attorney, Agent, or Firm*—Brian R. Short

[57] ABSTRACT

A field programmable gate array (FPGA) memory system which allows the same array of memory to contain both configurable memory and user memory. The FPGA user logic can modify the information contained within the configurable memory and the user memory. The information stored within the configuration memory defines the logic within the user logic. Therefore, the user logic can modify sections of the logic within the user logic. The configuration memory and the user memory share resources such as address decoders, bitlines and sense amplifiers.

6 Claims, 4 Drawing Sheets

PROGRAMMABLE GATE ARRAY CONFIGURATION MEMORY WHICH ALLOWS SHARING WITH USER MEMORY

FIELD OF INVENTION

This invention relates generally to field programmable gate arrays (FPGAs). In particular, it relates to FPGAs in which a single array of memory comprises both configurable memory and user memory, and in which both logic circuits of the FPGA and an external controller can access the configurable memory and the user memory.

BACKGROUND

FPGAs are revolutionizing the way digital electronics system designers implement logic. By radically reducing the development costs and the turnaround time for implementing thousands of gates of logic, FPGAs provide new capabilities that affect the semiconductor industry. FPGAs are changing the way digital systems will be designed in the future.

The use of programmable logic devices such as FPGAs has become widespread because of the flexibility they provide. A FPGA typically includes an array of programmable logic blocks that can be programmably interconnected to each other to provide the logic function desired by the digital electronics designer. Each of the programmable logic blocks may be individually programmed to perform any one of a number of different logic functions. The FPGA has configurable routing matrices for coupling the programmable logic blocks together according to a desired configuration. The FPGA also includes configuration memory cells. The configuration memory cells are coupled to the programmable logic blocks for specifying the function performed by each programmable logic block, and to the configurable routing matrices for specifying the coupling of the inputs and the outputs of the programmable logic blocks. Each programmable logic block is coupled to several configuration memory cells. Each configuration routing matrix is coupled to several configuration memory cells. By storing different values in the configuration memory cells, each programmable logic block may be individually programmed as to its function and coupling.

Each programmable logic block and configurable routing matrix comprise a plurality of programmable switch elements. The settings of the programmable switch elements define the logic function performed by each programmable logic block and the coupling of the inputs and the outputs of the programmable logic blocks. The settings of the programmable switch elements are determined by the information stored within the configuration memory cells. Presently, each configuration memory cell corresponds to a particular programmable switch element. To modify the setting of a programmable switch element and thereby modify the logic defined by a logic block, the information within the configuration memory cells must be modified.

The logic which the programmable switch elements define is generally designated as user logic. Typically, the user logic within a FPGA requires user memory during operation. User memory is memory that the user logic has the capability to access. The configurable memory in which the FPGA user logic configuration is stored is not accessible as user memory. Generally, it is believed that allowing configuration memory to be used as user memory is too risky because of the possibility that the user might inadvertently reconfigure the FPGA causing faulty operation. Therefore, separate user memory is generally implemented. The implementation of separate configuration memory and user memory leads to a duplication of resources associated with the user memory and the configuration memory. Duplicated resources include row and column address decoders to the memory and sense amplifiers and read/write circuits for driving the memory input and output. Duplication of memory resources requires more power, costs and physical size than if the memory resources were not duplicated. Duplication of resources also requires more interconnection circuitry which slows down the operation speed of the memory.

Presently, FPGAs operate in two basic modes. The first mode is a download mode in which the configurable memory is loaded with the desired FPGA user logic configuration. The second mode is a user mode in which no external controller access to the configurable memory is allowed.

When a FPGA is in the download mode, the configurable memory is accessible by a controller external to the FPGA chip. External controller access is allowed so that the external controller may load the desired FPGA configuration into the configurable memory of the FPGA. Generally, the FPGA is not functional when the FPGA is in the download mode. That is, the FPGA is not yet serving the function of the intended use of the FPGA.

When a FPGA is in the user mode, the configurable memory of the FPGA is not accessible by an external controller. Access is not allowed because of the risk that the FPGA configuration could be overwritten leading to an undefined FPGA configuration. Generally, the FPGA is functional when the FPGA is in the non-program mode. That is, the FPGA is serving the function of the intended use of the FPGA.

A system that incorporates a FPGA 1 is shown in FIG. 1. An external controller 2 stores information in a configuration memory 3 of the FPGA 1. The information stored within the configuration memory configures user logic 4 of the FPGA 1. A separate user memory 5 is required by the user logic 4 during operation. This system is redundant because two separate allocations of memory 3, 5 are supported. The system requires both configurable memory 3 and user memory 5. Electronic circuitry is duplicated. The configurable memory 3 requires a column address decoder 6, a row address decoder 8 and input/output sense amplifiers with read/write circuits 10. The user memory 5 requires a column address decoder 7, a row address decoder 9 and input/output sense amplifiers with read write circuits 11. Maintaining the configurable memory 3 and the user memory 5 requires more power and physical space than would be required if the configurable memory 3 and the user memory 5 were combined.

The capabilities of the system are limited because the user logic 4 cannot modify the configuration memory 3. Only the external controller 2 has the capability of modifying the configuration memory 3. Therefore, only the external controller 2 has the capability to modify the user logic 4 within the FPGA.

Electronic devices are increasingly becoming portable. To remain competitive in the portable electronics market, electronic manufactures must constantly be developing smaller, less expensive and more power efficient electronic devices.

There exists a need for FPGA chips that have on chip memory that can be used as both configurable memory and user memory in which the configuration memory and the user memory is accessible by both the user logic within the FPGA and by an external controller.

SUMMARY OF THE INVENTION

The present invention discloses a FPGA memory architecture that allows the same on-chip FPGA memory to be used as configurable memory and as user memory. The architecture of this invention allows the user logic of the FPGA to modify information stored within the configuration memory cells. Therefore, the user logic has the capability to modify the logic that the user logic comprises. This capability allows the FPGA memory architecture of this invention to be used to solve complex problems quicker than is presently possible.

The FPGA memory architecture of this invention also provides a reduction in electronic circuitry. Therefore, a reduction in cost, power and integrated circuit surface area can be realized.

An embodiment of this invention includes a shared FPGA configuration memory system. The system includes a user defined logic block comprising a plurality of logic function modules, a plurality of sharable memory cells and a plurality of reconfigurable memory cells. Each logic function module comprises a plurality of programmable switch elements. Each reconfigurable memory cell is electrically connected to a corresponding programmable switch element. Therefore, the information stored within the reconfiguration memory cells configures logic functions within each logic function module. The configured logic functions within a logic function module can modify the reconfigurable memory cells corresponding to the programmable switch elements within the other logic function modules.

In another embodiment, an external controller can also read and write information to the reconfigurable memory cells and the shareable memory cells.

In another embodiment, one of the logic function modules is designated as a master logic function module which can write into the reconfigurable memory cells corresponding to the programmable switch elements within all other logic function modules. However, no other logic function module can write to the configuration memory cells corresponding to the programmable switch elements within the master logic function module.

Other aspects and advantages of the present invention will become apparent from the following detailed description, taken in conjunction with the accompanying drawings, illustrating by way of example the principles of the invention.

DETAILED DESCRIPTION

Figure 1:
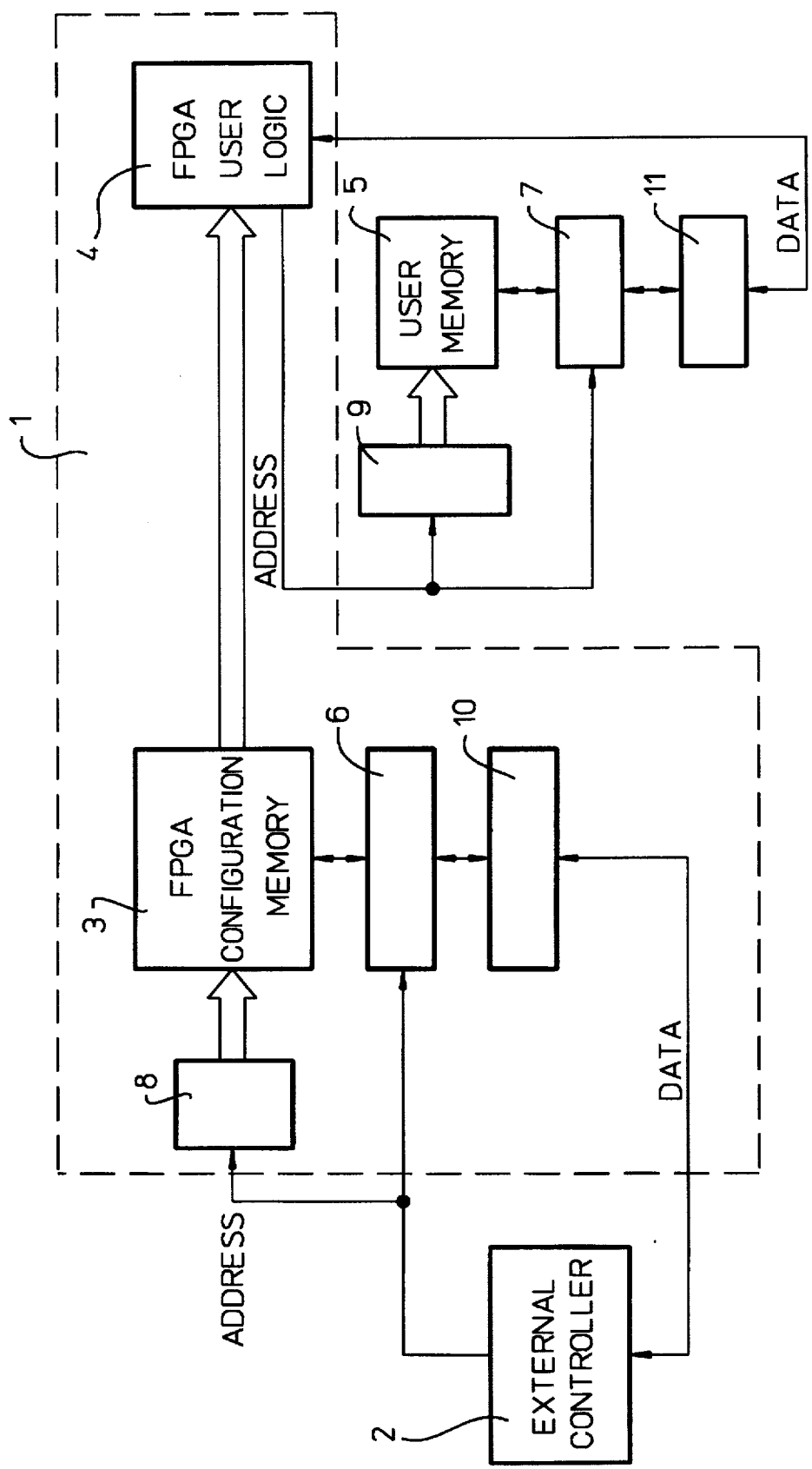
FIG. 1 shows a prior art FPGA system that requires both FPGA configurable memory and separate user memory.

As shown in the drawings for purposes of illustration, the invention is embodied in a FPGA memory architecture. The FPGA memory architecture of this invention allows the same memory to be used as both FPGA configurable memory and as user memory. When the FPGA is in download mode an external controller can access the configuration memory and the user memory. When the FPGA is in user mode the user logic defined by the configuration memory can access the configuration memory and the user memory. Therefore, the user logic has the capability to modify the logic that the user logic comprises.

The FPGA memory architecture of this invention allows the user logic as defined by the information stored within the configuration memory to read from and to write to the configuration memory. By allowing the user logic to read from and write to the configuration memory, the user logic can actually modify sections of the logic within itself. The results can be disastrous if the user logic is not designed correctly. However, if designed correctly the user logic design can be very dynamic and powerful.

The user logic can be sectioned into modules. One of the modules can be designated as the master module. The master module is configured to operated as a controller which has the capability to modify the logic within the other modules within the user logic. The designation of a master module that has control over the logic within the other modules reduces the risk that the user logic will configure itself into an undefined state or configuration.

Most FPGA user logic requires user memory to properly operate. All FPGAs require configurable memory. This invention allows the user memory and the configurable memory to share memory resources such as sense amplifiers, bit lines and address decoders. Therefore, this invention also reduces cost, physical size and power consumption.

Figure 2:
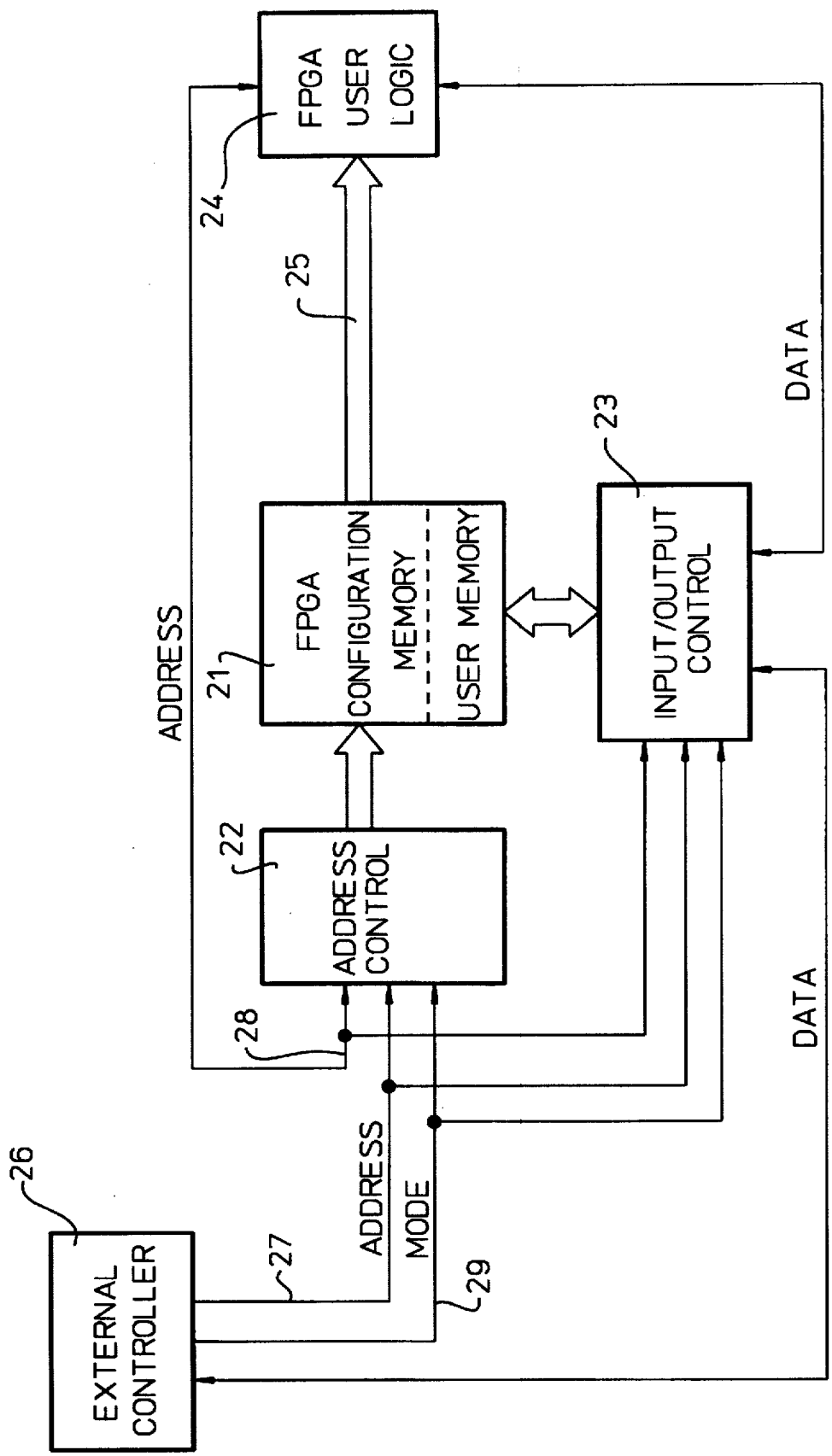
FIG. 2 shows a FPGA memory architecture according to this invention.

FIG. 2 shows an embodiment of this invention. A single array of memory 21 comprises rows and columns of memory cells. The single array of memory 21 comprises both the FPGA configurable memory and user memory. The configurable memory and the user memory share support circuitry such as data address control within an address controller 22 and data input/output control within an input/output controller 23.

Each memory cell within the configuration memory is electrically connected to at least one programmable switch element within a FPGA user logic block 24 through a plurality of conductors 25. The settings of the programmable switch elements determine the logic functions within the user logic block 24. Therefore, the information stored within the configuration memory cells defines the logic functions within the user logic block 24.

The configuration memory is initially loaded with information by an external controller 26 while the FPGA is in the download mode. After the configuration memory has been loaded the external controller 26 switches the FPGA into the user mode. The external controller 26 must switch the FPGA back into the download mode in order for the external controller 26 to reload or modify the configuration memory.

After the configuration memory has been loaded by the external controller 26 and the FPGA has been switched to the user mode, the user logic block 24 may access the configuration memory and the user memory. The user logic block 24 can use the user memory for storing information during a calculation and the user logic block 24 can modify the configuration memory to reconfigure a portion of the user logic block 24.

A row of memory cells within the array of memory 21 is selected by the address controller 22. The address controller 22 is responsive to controller address inputs 27 from the external controller 26 when the FPGA is in download mode and is responsive to user address inputs 28 from the user logic block 24 when the FPGA is in the user mode.

The input/output controller 23 selects column(s) of memory within the array of memory 21 and provides a data information path. The input/output controller 23 is responsive to the controller address inputs 27 and provides a data path from the array of memory 21 to the external controller 26 when the FPGA is in download mode. The input/output controller 23 is responsive to the user address inputs 28 and provides a data path from the array of memory 21 to the user logic 24 when the FPGA is in user mode.

The external controller 26 determines whether the FPGA is in the download mode or the user mode. To set the FPGA into the download mode, the external controller 26 activates a mode line 29. When the mode line 29 has been activated, the address controller 22 only allows the external controller to address the array of memory 21. When the mode line 29 has been activated, the input/output controller 23 only allows the data from the array of memory to transfer between the array of memory and the external controller.

To set the FPGA into user mode, the external controller 26 deactivates the mode line 29. When the mode line 29 has been deactivated, the address controller 22 only allows the user logic block 24 to address the array of memory 21. When the mode line 29 has been deactivated, the input/output controller 23 only allows the data from the array of memory to transfer between the array of memory and the user logic block 24.

Figure 3:
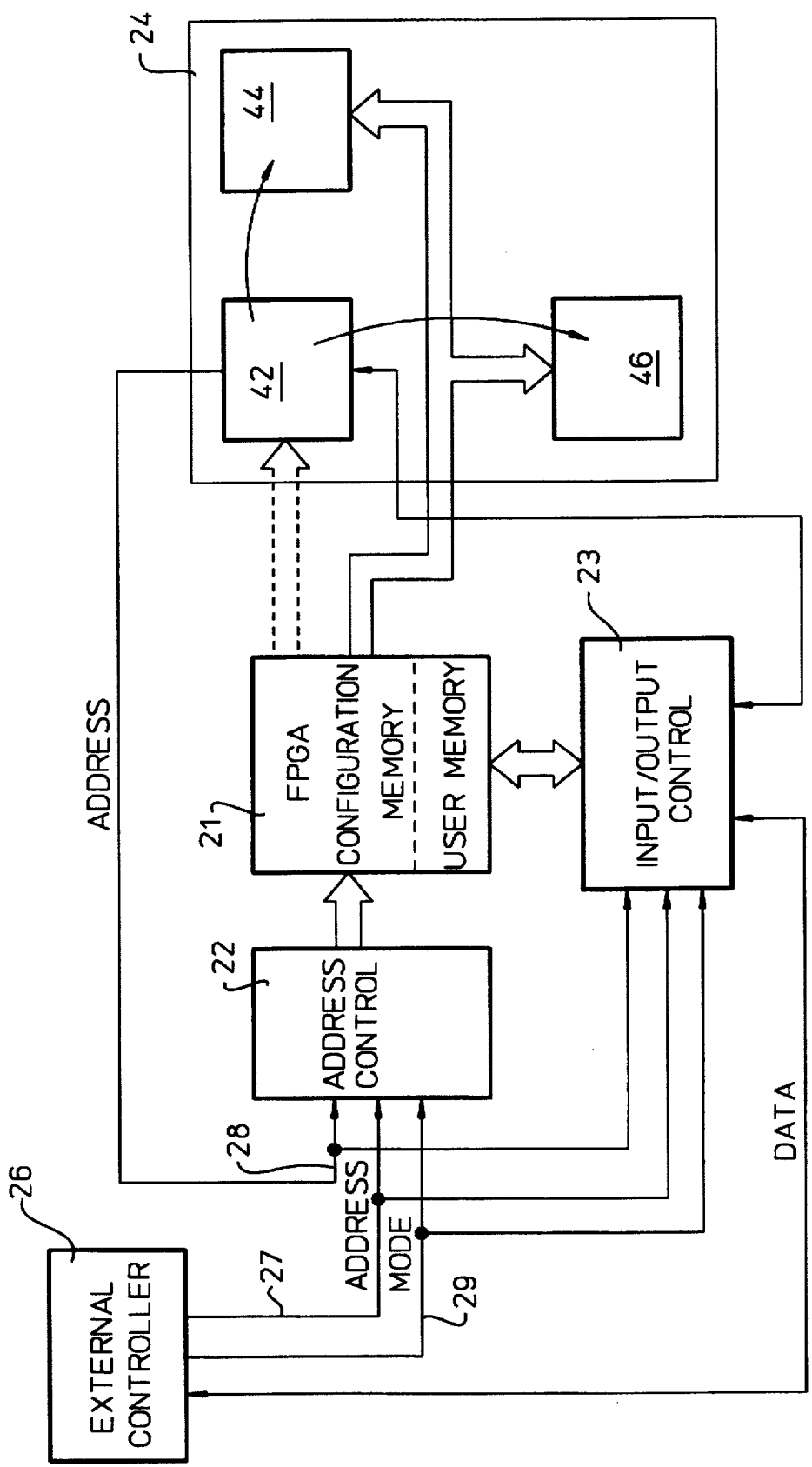
FIG. 3 depicts modules within the user logic in which a master module can modify the logic within servant modules.

FIG. 3 depicts the user logic block 24 and modules of logic 42, 44, 46 within the user logic block 24. In user mode, the user logic block 24 within the FPGA can write to the configuration memory. Therefore, the user logic block 24 can modify itself if certain conditions are satisfied. The ability of the user logic block 24 to modify itself is extremely risky. The risk is that the user logic block 24 will write into the configuration memory information that renders the user logic block 24 unusable. The risk can be eliminated by sectioning the user logic block 24 into modules 42, 44, 46 and designating one of the modules 42, 44, 46 as the master module. FIG. 3 shows module 42 as the master module and depicts the control the master module 42 has over the logic within the other modules 44, 46. The master module can be designated to control all of the writing by the user logic block 24 into the configuration memory. The master module can be configured so that the master module can write to the configuration memory cells that configure the logic of other modules 44, 46 but the configuration memory cells that correspond to the master module can not be written into. Therefore, the logic surrounding the master module within the user logic block 24 may be modified but the logic within the master module is never modified.

This invention may be used to implement self repairing logic. FPGAs can have sections of user logic that are not fabricated properly and cannot be operated reliably. Self repairing logic can be implemented which detects problem areas within the user logic. Self repairing logic within the user logic can reconfigure the information stored within the configuration memory cells which correspond to the user logic to avoid the sections of user logic that were not fabricated properly. Therefore, the logic that is initially stored in the user logic checks itself for faulty operation. If any faulty operation is detected the self repairing logic within the user logic isolates where in the user logic the faulty operation resides and reconfigures the information stored within the configuration memory so that the faulty areas of the user logic are not operable.

This invention can also be used to implement in hardware what is termed a self reproducing algorithm. A self reproducing algorithm can be used to obtain the most efficient solution to a particular problem. For instance, a self reproducing algorithm can be used to determine the best move of a chess piece in a simulated chess game or for optimizing a circuit element within an electronic circuit.

The determination of the best chess piece move requires calculating how good each individual move of all the possible moves is. Therefore, a calculation must be made for every possible move. The calculation that yields the optimal result is the best move. Each best move calculation must include all of the possible future moves after the present move. The number of calculations add up very quickly and demand a great amount of computational power and memory.

Implementation of a self reproducing algorithm with this invention can significantly reduce the computational time required for a self reproducing algorithm to solve a particular problem. The calculations of the self reproducing algorithm are implemented in hardware which is much quicker than standard software implementations.

The self reproducing algorithm is implemented with this invention by initially storing a configuration within the configuration memory of the FPGA. The initial configuration represents the calculation required for the first of all of the possible chess moves. After performing the initial calculation, the user logic block modifies itself to a new configuration which is dependent upon the outcome of the initial calculation. After the calculation of the new configuration, the process repeats. The user logic configurations and the calculated values for each configuration are stored within the user memory. After all of the possible configurations have been exhausted, meaning that all possible moves of the chess piece have calculated, the user memory contains all of the possible configurations and the associated results. Therefore, the best configuration corresponding to the best chess piece move can be determined.

All of the calculations are made in hardware. Therefore, each individual calculation is very quick. As a result, the present invention yields a result significantly faster than is presently possible.

Figure 4:
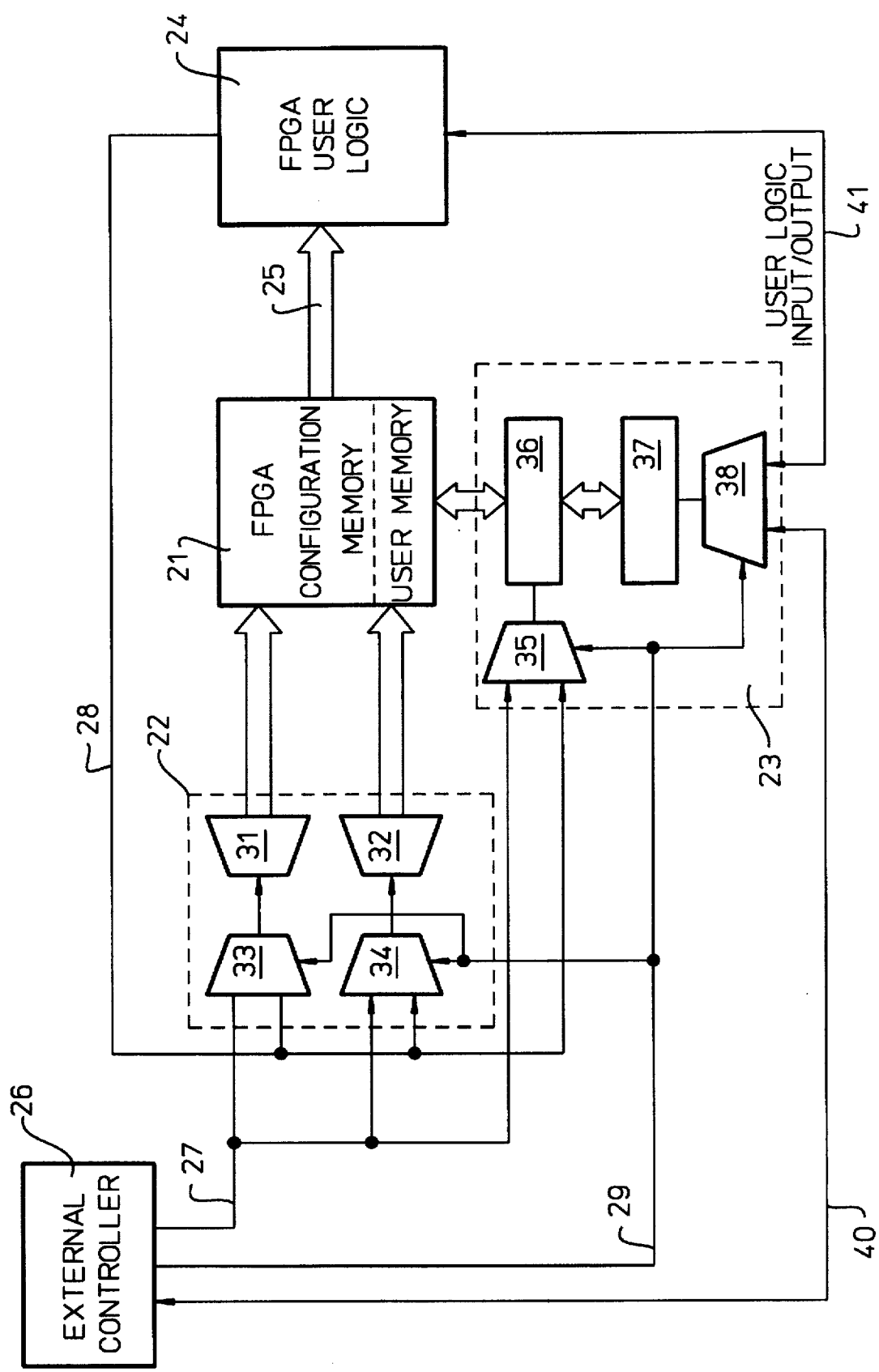
FIG. 4 shows an implementation of the FPGA memory architecture according to this invention.

FIG. 4 shows an implementation of the address controller 22 and the input/output controller 23 of FIGS. 2 and 3.

The address controller 22 of FIG. 4 includes a configuration row decoder 31, a user row decoder 32, a configuration row multiplexer 33 and a user row multiplexer 34.

The configuration row multiplexer 33 and the user row multiplexer 34 receive both the controller address inputs 27 and the user address inputs 28. The output of the configuration row multiplexer 33 is connected to the input of the configuration row decoder 31. The output of the user row multiplexer 34 is connected to the input of the user row decoder 32. The configuration row multiplexer 33 and the user row multiplexer 34 also receive the mode line 29 from the external controller 26. When the mode line 29 is activated the configuration row multiplexer 33 and the user row multiplexer 34 pass the controller address inputs 27 through to the configuration row decoder 31 and the user row decoder 32. When the mode line 29 is deactivated the configuration row multiplexer 33 and the user row multiplexer 34 pass the user address inputs 28 through to the configuration row decoder 31 and the user row decoder 32.

Conditioned on whether the mode line 29 is activated the configuration row decoder 31 decodes either the controller address inputs 27 or the user address inputs 28, and determines which row of the configuration memory is to be accessed. Conditioned on whether the mode line 29 is activated the user row decoder 32 decodes either the controller address inputs 27 or the user address inputs 28, and determines which row of the user memory is to be accessed.

The input/output controller 23 includes a column decoder 36, a column multiplexer 35, a column buffer 37 and a data multiplexer 38.

The column multiplexer 35 receives both the controller address inputs 27 and the user address inputs 28. The output of the column multiplexer 35 is connected to the column decoder 36. When the mode line 29 is activated the column multiplexer 35 passes the configuration address inputs 27 through to the column decoder 36. When the mode line 29 is deactivated the column multiplexer 35 passes the user address inputs 27 through to the column decoder 36.

Conditioned on whether the mode line 29 is activated the column decoder 36 decodes either the controller address inputs 27 or the user address inputs 28, and determines which column(s) of the user memory is to be accessed.

Configuration or user memory generally includes a buffer like the column buffer 37 shown in FIG. 4. The buffer typically includes sense amplifiers. The column buffer 37 is shown here to emphasize the fact that circuitry associated with the configuration memory and the user memory is minimized by combining the configuration memory and the user memory.

The data multiplexer 38 receives the mode line 29. If the mode line 29 is active, the data multiplexer 38 connects the column buffer 37 to a controller data bus 40 so that the external controller 26 can either read or write data to the array of memory 21. If the mode line 29 is not active, the data multiplexer 38 connects the column buffer 37 to a user data bus 41 so that the user logic block 24 can either read or write data to the array of memory 21.

Although specific embodiments of the invention have been described and illustrated, the invention is not to be limited to the specific forms or arrangements of parts so described and illustrated. The invention is limited only by the claims.

What is claimed:

1. A shared FPGA configuration memory system comprising:

a user defined logic block comprising a plurality of logic function modules wherein each logic function module comprises a plurality of programmable switch elements;

a plurality of sharable memory cells; and a plurality of reconfigurable memory cells, each reconfigurable memory cell electrically connected to a corresponding programmable switch element thereby configuring logic functions within each logic function module, wherein one of the logic function modules is designated as a master logic function module which can write into the reconfigurable memory cells corresponding to the programmable switch elements within the other logic function modules but no other logic function module can write to the configuration memory cells corresponding to the programmable switch elements within the master logic function module.

2. The shared FPGA configuration memory system as recited in claim 1, wherein the reconfigurable memory cells and the sharable memory cells share memory support circuitry.

3. The shared FPGA configuration memory system as recited in claim 2, wherein the support circuitry comprises sense amplifiers.

4. The shared FPGA configuration memory system as recited in claim 2, wherein the support circuitry comprises input/output logic.

5. The shared FPGA configuration memory system as recited in claim 2, wherein the support circuitry comprises read/write control logic.

6. A shared FPGA configuration memory system comprising:

a user defined logic block comprising a plurality of logic function modules wherein each logic function module comprises a plurality of programmable switch elements;

a plurality of sharable memory cells;

a plurality of reconfigurable memory cells, each reconfigurable memory cell electrically connected to a corresponding programmable switch element thereby configuring logic functions within each logic function module, wherein a particular logic function module can modify the reconfigurable memory cells corresponding to the programmable switch elements within the other logic function modules;

an external controller which can read and write information to the reconfigurable memory cells and the sharable memory cells;

a mode line received from the external controller;

an address controller for selecting a row of memory cells within a plurality of memory cells comprising the sharable memory cells and the reconfigurable memory cells, the address controller responsive to address inputs from the external controller when the mode line is activated, the address controller responsive to address inputs from the user defined logic block when the mode line is deactivated; and an input/output controller for selecting a column of memory cells within the plurality of memory cells comprising the sharable memory cells and the reconfigurable memory cells, the input/output controller responsive to address inputs from the external controller when the mode line is activated, the input/output controller responsive to address inputs from the user defined logic block when the mode line is deactivated.

* * * * *